US005128825A

United States Patent [19]

Hurley et al.

[11] Patent Number: 5,128,825

[45] Date of Patent: Jul. 7, 1992

[54] ELECTRICAL CONTACTOR WITH CONTROLLED CLOSURE CHARACTERISTIC

[75] Inventors: Rick A. Hurley, Fletcher; Bruce R. Quayle, Asheville, both of N.C.

[73] Assignee: Westinghouse Electric Corp., Pittsburgh, Pa.

[21] Appl. No.: 473,521

[22] Filed: Feb. 1, 1990

[51] Int. Cl.[5] ...................... H01H 47/26; H01H 9/00; G01R 19/00

[52] U.S. Cl. .................................... 361/154; 361/205; 364/483; 335/231

[58] Field of Search ................................ 361/154-155, 361/187, 205, 160, 152-153, 194; 364/483; 335/231

[56] References Cited

U.S. PATENT DOCUMENTS 4,720,761 1/1988 Saletta ................................ 361/152
4,720,763 1/1988 Bauer ................................... 361/54
4,833,565 5/1989 Bauer et al. .......................... 361/154

*Primary Examiner*—Steven L. Stephan
*Assistant Examiner*—Adolf Berhane
*Attorney, Agent, or Firm*—M. J. Moran

[57] ABSTRACT

A microprocessor controlled electrical contactor monitors the voltage and peak current produced by a first voltage pulse gated to the coil of the contactor electromagnet and adjusts the conduction angle of the second pulse to deliver a constant amount of electrical energy to the electromagnet coil despite variations in coil resistance and supply voltage so that the contactor contacts can be consistently closed with low impact velocity and minimum contact bounce. Normally, the third and subsequent pulses are gated to the coil at constant conduction angles selected so that the contacts consistently touch and seal on a preselected pulse with declining coil current. Under marginal conditions, determined by the peak current produced by the first pulse, the third and subsequent pulses are gated at substantially full conduction angles to assure contact closure. If the voltage or current produced by the first pulse is below a predetermined value, closure is aborted.

33 Claims, 7 Drawing Sheets

LOOK-UP TABLE

| POINTER | $P_3$ | $P_4$ | $P_5$ | $P_6$ | $P_7$ |
|---|---|---|---|---|---|
| 1 | 3.9 | 5.0 | 1.1 | 6.1 | 6.1 |
| 0 | 1.1 | 1.1 | 1.1 | 1.1 | 1.1 |
| F | ABORT | | | | |

ELECTRICAL CONTACTOR WITH CONTROLLED CLOSURE CHARACTERISTIC

BACKGROUND OF INVENTION

1. Field of Invention

This invention relates to electrical contactors and more particularly to electrical contactors in which the contacts are closed by controlling the application of voltage pulses to the coil of an electromagnet.

2. Background Information

Electrical contactors are electrically operated switches used for controlling motors and other types of electrical loads. An example of such an electrical contactor is disclosed in U.S. Pat. No. 4,720,763. These contactors include a set of movable electrical contacts which are brought into contact with a set of fixed contacts to close the contactor. The contacts are biased open by a kickout spring. A second spring, called a contactor spring, begins to compress as the moving contacts first contact the fixed contacts. The contactor spring determines the amount of current that can be carried by the contactor and the amount of contact wear that can be tolerated. The movable contacts are carried by the armature of an electromagnet. Energization of the electromagnet overcomes the spring forces and closes the contacts.

In earlier contactors, the energy applied to the coil of the electromagnet was substantially in excess of that required to effect closure. While it is desirable to have a positive closing to preclude welding of the contacts, the excess energy is unnecessary and even harmful. If the armature of the electromagnet seats while traveling at a high velocity, the excess kinetic energy is absorbed by the mechanical system as shock, noise, heat, vibration and contact bounce.

Pat. No. 4,720,763 discloses a contactor controlled by a microcomputer which triggers a track to gate full wave rectified ac voltage pulses to the electromagnet coil to more closely control the electrical energy used to close the contacts. The profile is divided into four phases: an acceleration phase; a coast phase; a grab phase; and a hold phase. In the acceleration phase, sufficient electrical energy is supplied to accelerate the armature to a velocity which gives the system enough kinetic energy to fully close the contacts against the spring forces. To assure positive closure, the kinetic energy imparted to the armature is such that it still has a small velocity as the armature seats against the magnet, but the excess energy is very small compared to that remaining at full closure in earlier contactors. The conduction angle of the track is selected to provide the previously empirically determined amount of energy needed during the acceleration phase.

In the exemplary system of Pat. No. 4,720,763, portions of two half cycles of the fullwave rectified voltage are gated to the electromagnet coil during the acceleration phase. The conduction angles for these two half cycles are stored in the microcomputer memory. In the coast phase, the armature loses velocity as the kickout spring is compressed and then decelerates more rapidly as the contacts touch and the heavier contactor spring begins to compress. A longer delay, and therefore, a smaller conduction angle is used for the one pulse provided during the coast phase. In the grab phase, the armature seats against the electromagnet. Three larger pulses, that is pulses with larger conduction angles, are used to seal the contacts in during the grab phase and prevent contact bounce. Ideally, the conduction angle for the grab phase is selected such that the first grab pulse is turned on just as the armature touches. In the hold phase, smaller pulses, that is pulses which are substantially phase delayed, are used to maintain contact closure.

In the acceleration grab and hold phases, feed forward control is used. Fixed values of the track conduction angle for these three phases are stored in computer memory. To accommodate for variations in the amplitude of the voltage pulses, Pat. No. 4,720,763 stores three values for each conduction angle for the acceleration, coast and grab phases for three ranges of the voltage amplitude. In the hold phase, a closed loop control circuit is used to maintain a coil current selected to maintain contact closure.

While the microcomputer controlled contactor of Pat. No. 4,720,763 is a great improvement over earlier contactors, and goes a long way toward controlling coil current during closure to reduce the kinetic energy of the armature as it seats against the electromagnet, there is room for improvement. For instance, it has been determined that the contact closure characteristic is dependent upon variations in coil resistance which are not taken into account by the control system of Pat. No. 4,720,763. Such changes in coil resistance are attributable to such factors as, for example, temperature changes and variations in the production process such as stretched wire. Thus, while a good closing sequence using a specific number of phased back half line voltage pulses was determinable experimentally, after a number of operations the profile required adjustment because the closing characteristics, such as contact bounce degraded. One difficulty in making adjustments in the closing profile is the very short duration of the entire cycle.

There is need therefore, for an improved contactor which provides positive closure without contact bounce.

There is also a need for such an improved contactor which uses phase controlled voltage pulses to provide the energy required for such positive closure without contact bounce.

There is an additional need for such a contactor which takes into account dynamic changes in the characteristics of the contactor electromagnet.

There is a further need for such a contactor which can make adjustments within the very short time frame of the closing sequence.

SUMMARY OF THE INVENTION

These and other needs are satisfied by the invention which is directed to an electrical contactor which accommodates to the dynamic conditions of the contactor coil and the supply voltage to provide the consistent closure characteristics of low impact velocity and minimum contact bounce. The contactor in accordance with the invention gates a first voltage pulse to the coil of the contactor electromagnet at a fixed, preferably full, conduction angle, and monitors the electrical response of the coil, namely the peak current. The conduction angle of the second pulse is then adjusted based upon the peak current produced by the first voltage pulse and the voltage of the first pulse to provide, together with the first voltage pulse, a constant amount of electrical energy to the coil despite variations in coil resistance and supply voltage.

The third and subsequent voltage pulses to the coil of the contactor are gated at conduction angles preselected so that, with constant energy supplied by the first and second voltage pulses, the contacts touch and then seal at a substantially constant point in a selected pulse. Contact closure can occur at the third pulse, or in a large contactor where more energy is required, at a later pulse.

Contact touch and sealing consistently occurs on declining coil current to achieve the desired results of low impact velocity and minimum contact bounce.

While normally, the third and subsequent pulses are gated to the contactor coil at constant conduction angles, under marginal conditions for closure, that is where the peak current produced by the first voltage pulse is below a predetermined value, a second set of conduction angles is used to gate the third and subsequent voltage pulses to the coil. Substantially full conduction of the third and subsequent pulses is produced by this second set of conduction angles.

DESCRIPTION OF THE DRAWINGS

A full understanding of the invention can be gained from the following description of the preferred embodiment when read in conjunction with the accompanying drawings in which.

DESCRIPTION OF THE PREFERRED EMBODIMENT

Figure 1:
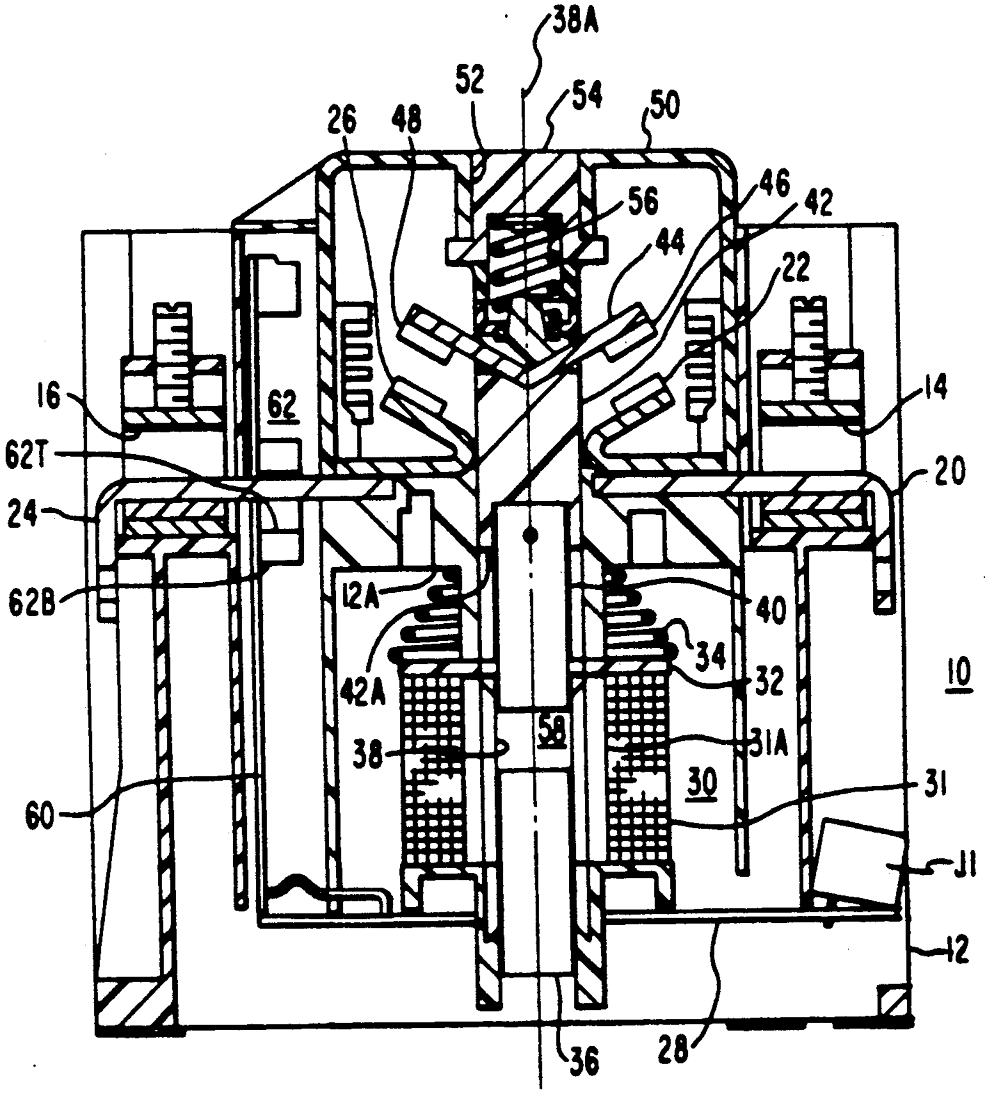
FIG. 1 is a vertical sectional view through a contactor incorporating the subject invention.

The invention will be described as applied to a threephase electrical contactor such as that disclosed in U.S. Pat. No. 4,720,763. Full details of the features of such a contactor can be gained by reference to that patent. FIG. 1 illustrates one pole of such a threephase electrical contractor, it being understood that the other two phases are similar. The contactor 10 comprises a housing 12 made of suitable electrically insulating material upon which are disposed electrical load terminals 14 and 16 for interconnection with an electrical apparatus, a circuit, or a system to be serviced or controlled by the contactor 10. Terminals 14 and 16 are spaced apart and interconnected internally with conductors 20 and 24 respectively, which extend into the central region of the housing 12. There, conductors 20 and 24 are terminated by appropriate fixed contacts 22 and 26, respectively. Interconnection of contacts 22 and 26 will establish circuit continuity between terminals 14 and 16 and render the contactor 10 effective for conducting electric current therethrough.

A coil control board 28 is secured horizontally in the housing 12. Disposed on the coil control board 28 is a coil or solenoid assembly 30 which may include an electric coil or solenoid 31. Spaced away from the coil control board 28 and forming one end of the coil assembly 30 is a spring seat 32 upon which is secured one end of a kickout spring 34. The other end of the kickout spring 34 bears against portion 12A of base 12 until movement of a carrier 42, in a manner to be described, causes bottom portion 42*a* thereof to pick up spring 34 and compress it against seat 32. This occurs in a plane transverse to the plane of FIG. 1 where the dimension of member 42 is larger than the diameter of spring 34. A fixed magnet or slug of magnetizable material 36 is disposed within a channel 38 radially aligned with the solenoid or coil 31 of coil assembly 30. Axially displaced from the fixed magnet 36 and disposed in the same channel 38 is an armature 40 of magnetically permeable material which is longitudinally (axially) moveable in the channel 38 relative to the fixed magnet 36. The armature 40 is supported and carried by the longitudinally extending electrically insulating contact carrier 42 which also carries an electrically conducting contact bridge 44. Opposed radial arms of contact bridge 44 support contacts 46 and 48. Of course, it is to be remembered that the contacts are in triplicate for a three pole contactor. Contact 46 abuts contact 22, and contact 48 abuts contact 26 when a circuit is internally completed between terminals 14 and 16 as the contactor 10 closes. On the other hand, when the contact 22 is spaced apart from the contact 46 and the contact 42 is spaced apart from the contact 48, the internal circuit between the terminals 14 and 16 is open. The open circuit position is shown in FIG. 1.

An arc box 50 encloses the contact bridge 44 and the contacts 22, 26, 46 and 48 to provide a partially enclosed volume in which electrical current flowing internally between the terminals 14 and 16 may be interrupted safely. There is provided centrally in the arc box 50 a recess 52 into which the cross bar 54 of the carrier 42 is disposed and constrained from moving transversely (radially) as shown in FIG. 1, but is free to move or slide longitudinally (axially) of the center line 38A' of the aforementioned channel 38.

Contact bridge 44 is maintained in carrier 42 with the help of contact spring 56. The contact spring 56 compresses to allow continued movement of the carrier 42 toward the slug 36 even after the contacts 22–46 and 26–48 have abutted or "made". Further compression of the contact spring 56 greatly increases the pressure on the closed contacts 22–46 and 26–48 to increase the current carrying capability of the internal circuit between the terminals 14 and 16 and to provide an automatic adjustment feature for allowing the contacts to attain an abutted or "made" position even after significant contact wear has occurred. The longitudinal region between the magnet 36 and the moveable armature 40 comprises an air gap 58 in which magnetic flux exists when the coil 31 is electrically energized.

Externally accessible terminals in a terminal block J1 are available on the coil control board 28 for interconnection with the coil or solenoid 31, among other things, by way of printed circuit paths or other conductors on the control board 28. The electrical energization of the coil or solenoid 31 by electrical power provided at the externally accessible terminals on terminal block Jl and in response to a contact closing signal available at externally accessible terminal block Jl for example, generates a magnetic flux path through the fixed magnet or slug 36, the air gap 58 and the armature 40. As is well known, such a condition causes the armature 40 to longitudinally move within the channel 38 in an attempt to shorten or eliminate the air gap 58 and to eventually abut or seat against magnet or slug 36. This movement is in opposition to or is resisted by the force of compression of the kick out spring 34 in the initial stages of movement, and is further resisted by the force of compression of the contact spring 56 after the contacts 22–46 and 26–48 have abutted at a later stage in the movement stroke of the armature 40.

There may also may be provided within the housing 12 of the contactor 10 an overload relay printed circuit board or card 60 upon which are disposed current-to-voltage transducers or transformers 62 (only one of which 62B is shown in FIG. 1). The conductor 24 extends through the toroidal opening 62T of the current-to-voltage transformer or transducer 62B so that current flowing in the conductor 24 is sensed. Current, thus sensed, is used by the present invention in a manner to be discussed below.

Figures 2, 7:
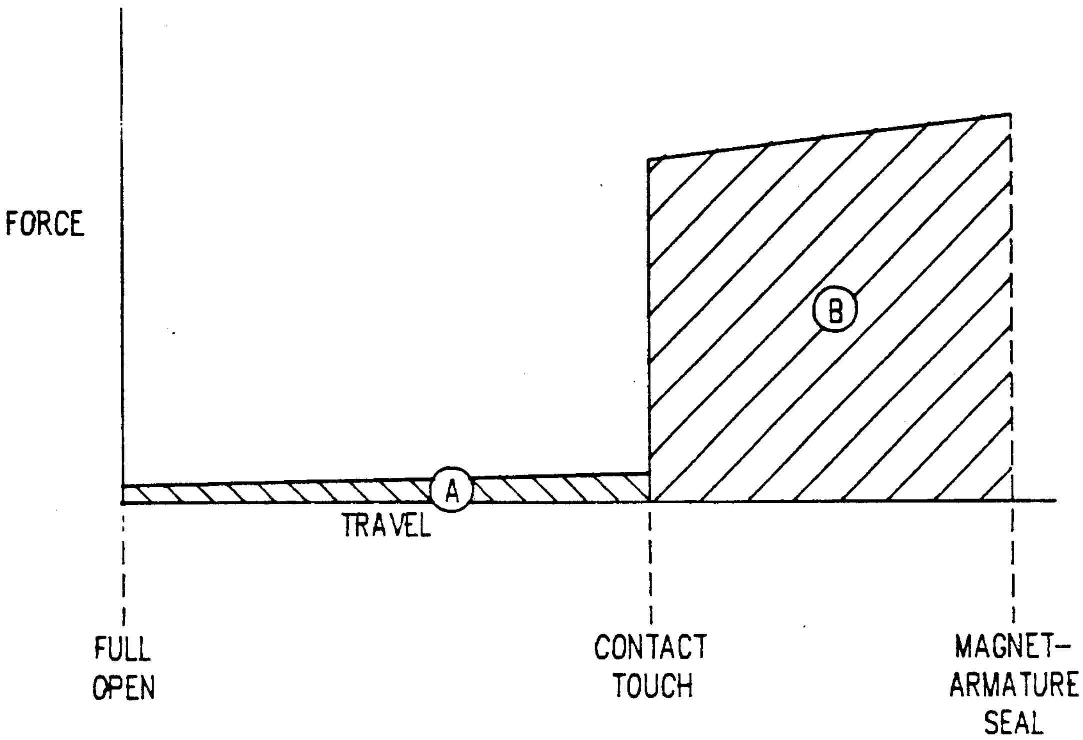
FIG. 2 illustrates a spring reaction curve for the contactor of FIG. 1.
FIG. 7 is a look-up table used by the microcomputer in implementing the invention.

FIG. 2 is a diagram illustrating the energy required to move the contactor moving system which includes the carrier 42, the bridge 44 with its contacts 46 and 48, and the armature 40, from the open position shown in FIG. 1 to the closed position in which armature 40 buts against the fixed magnet or slug 36. The shaded area labeled as A in FIG. 2 is the energy required to move the contactor moving system from the full open position of FIG. 1 to the contact touch position where the contacts 46 and 48 just make contact with the fixed contacts 22 and 26. To this point, only the weaker kick-out spring 34 resists movement. The shaded area labeled B in FIG. 2 is the energy required to move the contactor moving system from the contact touch position to the magnet armature seal position in which the armature 40 seats against the slug 36. This portion of travel is resisted not only by the kickout spring but also by the much stronger contact spring 56.

The total energy under the curves A and B of FIG. 2 must be imparted to the moving system in order to close and seal the contacts. If this energy is not provided, the spring forces will prevail and the contacts will not close. It is also important that at the contact touch point, the force applied to the moving system be more than that shown by the left boundary of the area B, otherwise the armature 40 will stall at this position, thus providing a very weak abutment of the contacts 22–46 and 26–48. This is an undesirable situation as the tendency for the contacts to weld shut is greatly increased under these conditions. Thus, it can be appreciated that the technique applied is to accelerate the armature 40 so that it does not stall at the touch point but continues through to the magnet-armature seal position. Ideally, it would be desirable to provide just the amount of energy needed to fully close the contacts. This is not practical, however, due to inevitable losses in the system and variations in parameters which are not controllable. Therefore, the desired profile is to have the armature 40 reach the fixed magnet 36 with a velocity sufficient to assure a seal in but low enough to avoid undue shock and contact bounce.

Figure 3:
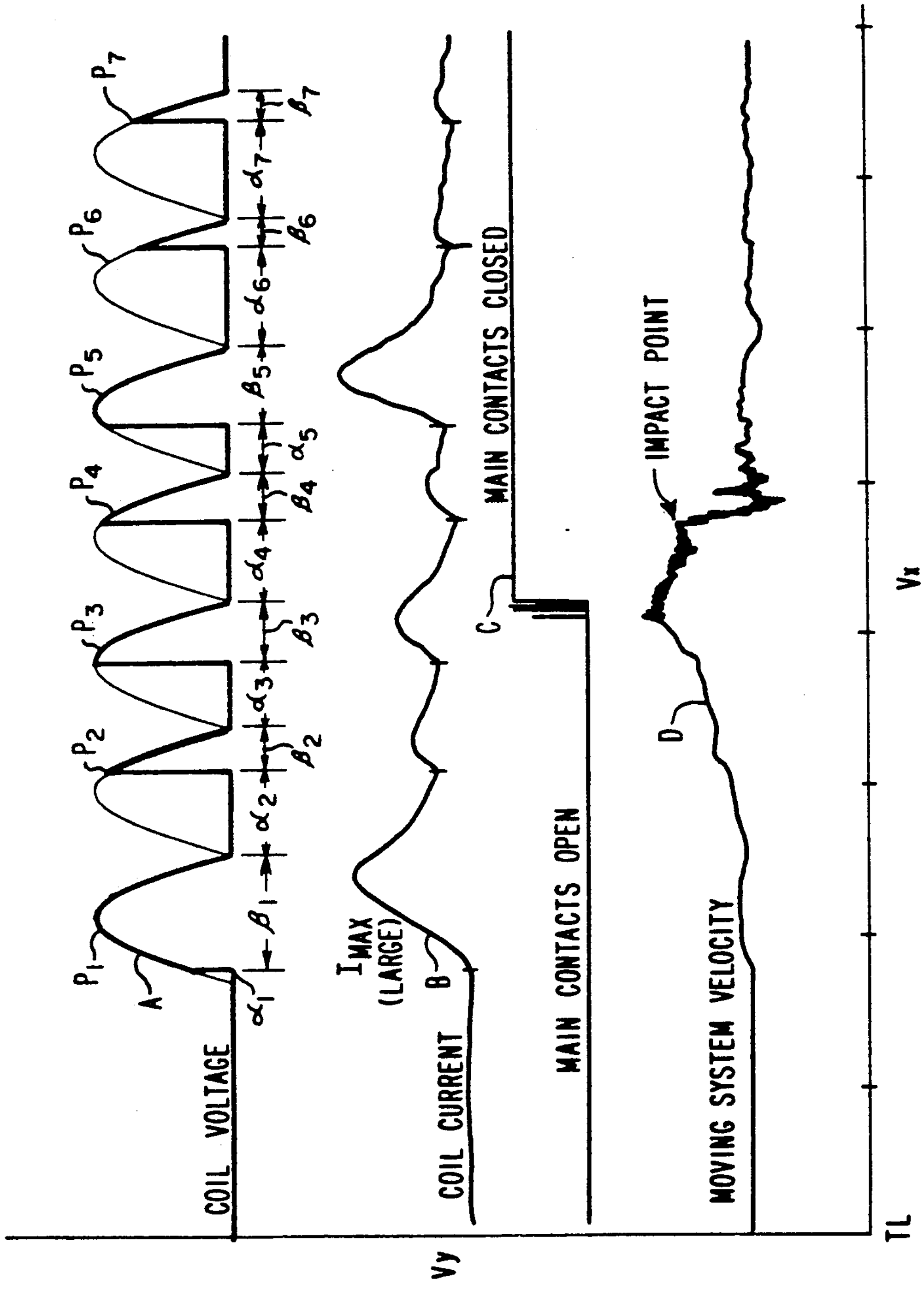
FIG. 3 illustrates coil voltage and current waveforms, main contact position, and moving system velocity for the contactor of FIG. 1 operated in accordance with the teachings of the invention.

FIG. 3 illustrates the manner in which the contactor coil 31 is energized in accordance with the invention. As will be seen later, a source of full wave rectified ac voltage pulses serves as a power source for the coil 31. A switch gates portions of these voltage pulses to the coil 31 under control of a microcomputer. The microcomputer synchronizes the turning on of the switch relative to the zero crossings of the voltage pulses to phase control gating of pulses to the coil 31 and thereby control the electrical energy input to the moving system.

In accordance with the invention, the first pulse Pl in trace A of FIG. 3 is a standard pulse which can be used to measure the electrical parameters of the system. It has a fixed delay angle $a_1$ and conduction angle $B_1$. These may be set at any desired values. In the exemplary system, angle $B_1$ is 100%. While the microcomputer generates a delay angle $a_1$ for the first pulse of zero, due to hardware delays, there is a slight delay as can be seen in trace A. It is preferred to use a full conduction first pulse so that if the pulse source is weak this large pulse will draw down the voltage and a determination can be made early to abort if there is insufficient power available to close the contactor. The computer monitors the current generated by the first pulse and its peak value together with a voltage measurement to determine the conduction angle for the second pulse. Thus, the conduction angle of the second pulse is adjusted to accommodate to the dynamic condition of the coil.

Figure 5A:
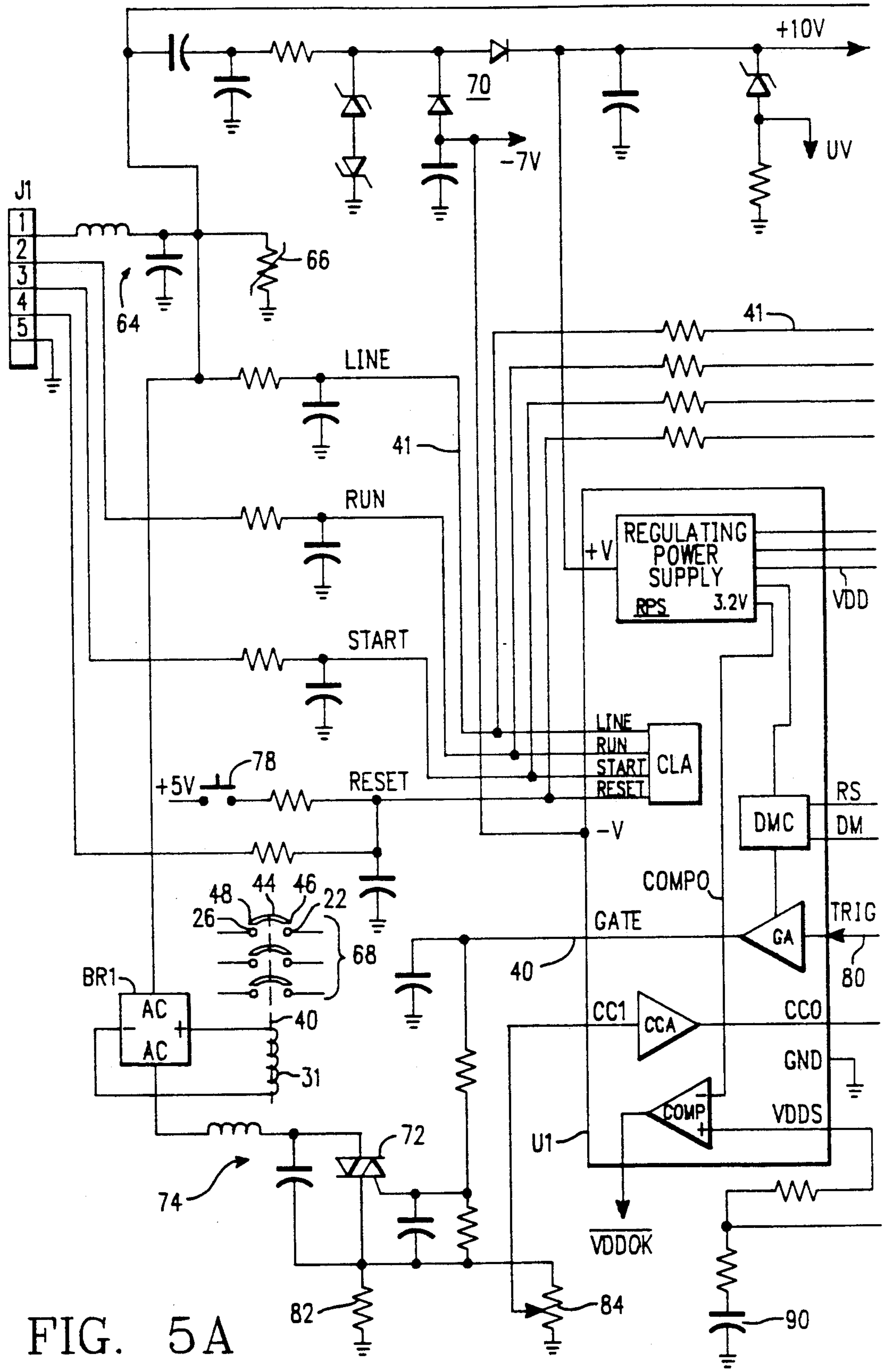
FIGS. 5A and 5B when placed side by side illustrate a schematic circuit diagram of a microcomputer based control circuit for controlling the contactor of FIG. 1 in accordance with the teachings of the invention.
Figure 5B:
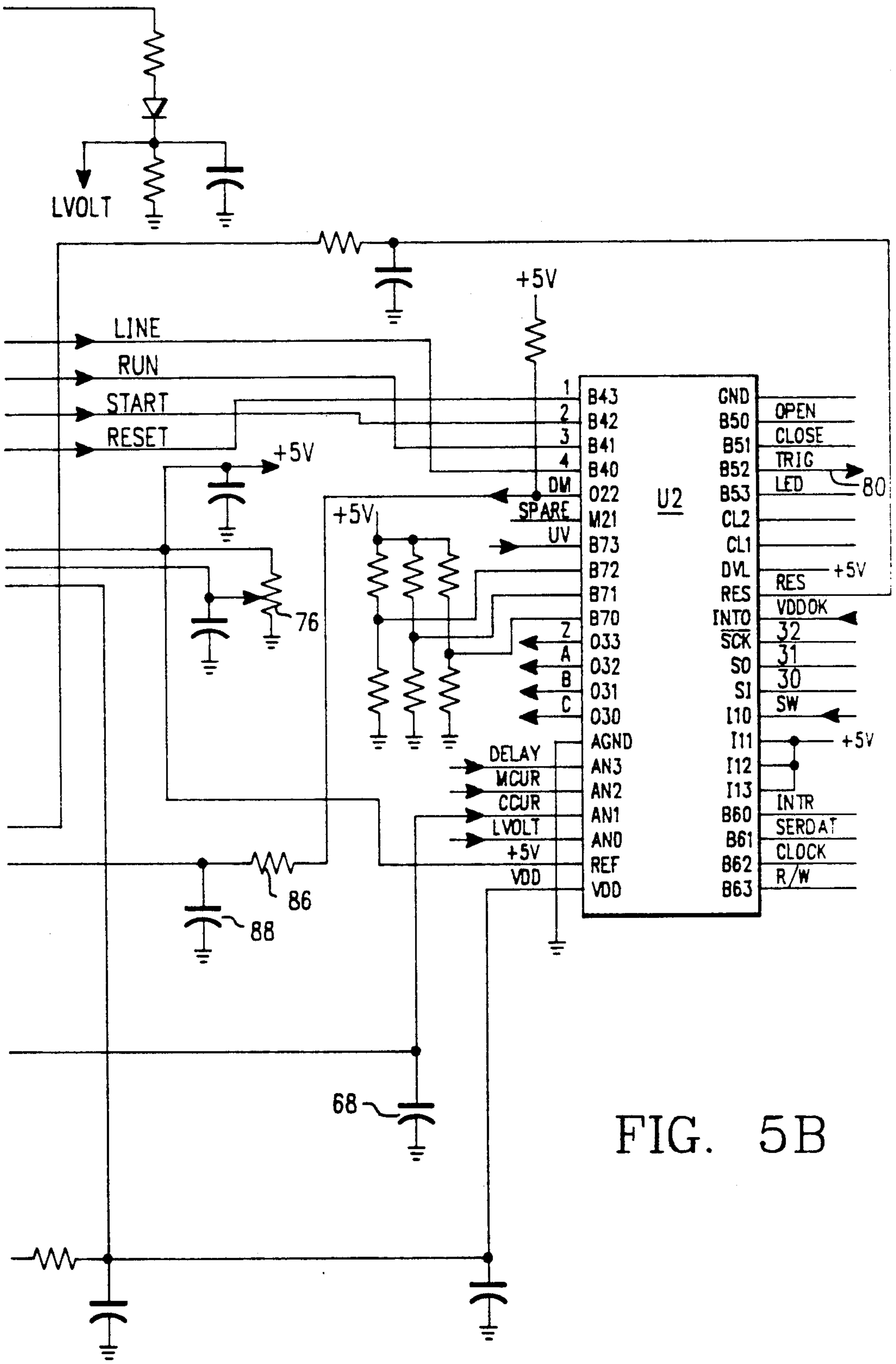

FIGS. 5A and 5B illustrate a schematic circuit diagram of the control circuit for controlling the contactor 1. Commercial 120 volt, 60 Hz power for the control circuit is provided through terminals 1 and 5 of terminal strip Jl. A first LC filter 64 removes noise from the power line and the resistor 66 suppresses spikes. The ac power is applied to a fullwave rectifier bridge circuit BRl which provides pulsed dc current to the contactor coil 31. As mentioned previously, energization of the coil 31 attracts the armature 40 connected to the bridge 44 to bring the moveable contacts 46–48 into electrical contact with the fixed contacts 22–26 for the three phases in electrical power line 68.

The filtered line current is also applied to a circuit 70 to generate unregulated −7 volts and +10 volt dc power supplies.

Energization of the coil 31 of the contactor 1 is controlled by a switch 72. This switch 72 may be a track, such as for example, a BCRV5AM-12, or other type of electronic switch such as a FET. A second LC filter 74 limits the rate of change of voltage across the track 72 to reduce noise sensitivity of the switch.

The switch 72 is controlled by a microcomputer U2 through a custom integrated circuit Ul. The integrated circuit Ul is similar to that disclosed in U.S. Pat. Nos. 4,626,831 and 4,674,035. The circuit Ul includes a regulating power supply RPS energized by the +10 volt supply applied to the +V input. The regulating power supply RPS generates a nominally +5 volt dc signal which may be trimmed by potentiometer 76. The 5 volt signal is applied to an analog input, REF, of the microcomputer U2 as a reference voltage. The regulating power supply RPS also generates a tightly regulated +5 volt dc signal VDD which is applied to the microcomputer U2 as the five volt microcomputer supply voltage. The regulating power supply RPS also supplies power to a deadman circuit DMC, the function of which will be explained shortly. The regulated power supply RPS further generates a 3.2 volt signal COMPO, which is applied to a comparator COMP for a purpose to be explained.

The filtered 120 volt ac current is applied to a LINE input to integrated circuit Ul, and to an input into the microcomputer U2. Similarly, a RUN signal input at terminal 2 of the terminal strip Jl, a START signal applied through terminal 3 and a RESET signal applied at terminal 4, are applied to corresponding inputs of the circuit Ul and to the microcomputer U2. A clipping and clamping circuit CLA in the integrated circuit Ul limits the range of these signals supplied to the microcomputer U2 to selected limits (+4.6 positive and −0.4 volts negative in the exemplary circuit) regardless of whether the associated signal is a dc or ac voltage signal. A button 78 powered by the +5 volt supply generated by the integrated circuit Ul permits manual generation of a RESET signal.

In response to the external control signals and its own internal program, the microcomputer U2 generates trigger pulses TRIG at an output port. These pulses are applied through a lead 80 to the TRIG input of the integrated circuit Ul. A gate amplifier GA within the integrated circuit Ul buffers and amplifies the trigger pulses and applies them through a GATE output to the gate electrode of the switch 72. As previously discussed, gating of the switch 72 is phase controlled relative to the ac line voltage by the timing of the trigger pulses by the microcomputer U2 to regulate the closing dynamics of the contactor contacts and to maintain the contactor closed. The voltage drop across a resistor 82, which is a measure of the current through the coil 31, is adjusted by a potentiometer 84 and applied to the CCI input of the integrated Ul where it is amplified in an operational amplifier CCA having a gain G. The resulting signal CCUR appearing at the output CCO of the integrated circuit Ul is applied to an analog input of the microcomputer U2. This signal, which is representative of the coil current, is used by the microcomputer to regulate the timing of the trigger pulses. The microcomputer U2 generates at an output 022 a squarewave deadman signal DM which, for normal operation of the microcomputer, has a duty cycle of about fifty percent. This signal is applied through a resistor 86 to an integrating capacitor 88 which extracts the dc component from the square wave signal. The dc signal is applied to the deadman circuit DMC in the integrated circuit Ul through the DM input. Whenever this dc signal exceeds preset high or low limits, a reset signal is generated at an RS output of the integrated circuit Ul. This RESET signal is applied to the RES input of the microcomputer U2 which resets the microcomputer. The deadman circuit DMC applies RESET signals to the microcomputer U2 on power up and also on loss of power. The deadman circuit DMC also generates a signal which is applied to the gating amplifier GA to terminate the generation of pulses when a RESET signal is generated.

A capacitor 90, which is kept charged by the regulated +5 volt power supply generated by RPS, provides an alternative power source to maintain the integrity of a random access memory RAM in the microcomputer U2 in the event of loss of power. If the microcomputer U2 detects a reset signal from the deadman circuit and a logical signal generated from a signal UV which decays with the loss of power, the microcomputer U2 transfers to a stop mode in which only the RAM is energized. The capacitor 90 is of sufficient size to supply power to the RAM for short term power losses. Upon power up the integrity of the RAM is checked by comparing the voltage across the capacitor 90 with the COMPO signal in comparator COMP to assure that adequate power had been applied to the microcomputer during the loss of normal power. This feature of the contactor is addressed in detail in commonly owned U.S. Pat. application Ser. No. 348,940 entitled Microcomputer Controlled Electrical Contactor with Power Loss Memory and filed on May 8, 1989 in the names of Robert T. Elms and Gary F Saletta and issued as U.S. Pat. No. 5,052,172 on Sep. 17, 1991.

In accordance with the invention, the delay of the second pulse $P_2$ in trace A of FIG. 3 is adjusted such that the total amount of energy put into the mechanical system is constant and therefore the time from the beginning of the first pulse $P_1$ to main contact touch shown in Trace C of FIG. 3 is constant over the range of voltages and coil resistances. In effect, the closing of the contactor is made to be synchronous with the coil voltage and current, and the performance of the contactor with respect to contact bounce and impact velocity is predictable, and constant with low magnitudes for both parameters.

To achieve the desired performance of low impact velocity and low contact bounce over the full range of operating voltages and coil resistances, it is required to have the contact touch point always occur at the same time relative to the coil voltage and current. The determination of the contact touch point is based on the fact that an initial pulse ($P_1$) and a control pulse ($P_2$) are required to measure and adjust for dynamic coil conditions. Therefore the third pulse ($P_3$) is the earliest that the contact touch point could occur. For larger devices which require more energy for closure, the contact touch point may not occur until a later pulse, such as the fourth or fifth pulse. However, experience teaches that the touch point will always occur on a descending coil current for best performance. The exact contact touch point is determined by the amount of energy required to seal the contactor from the contact touch position. As seen from FIG. 2, this energy is the energy in the shaded area labeled B. The contact touch position, see FIG. 3, Trace C, is established by having the kinetic energy of the armature at the touch point plus the energy in the pulse $P_3$ that moves the contactor from the contact touch point to the armature-magnet seal position (represented by the impact point shown on the moving system velocity curve which is Trace D in FIG. 3) slightly exceed the energy shown in FIG. 2. It is important that the current in the coil be declining from main contact touch to armature-magnet seal-in to assure a low velocity impact and minimum bounce. As can be seen from Traces A and B of FIG. 3, the current lags the voltage and does not go to zero between pulses due to the inductance of the coil 31.

Once the contact touch position is established, the next requirement is to put in enough energy to bring the contact from full open to contact touch at the proper position for low impact velocity and a moving system velocity that will give low contact bounce performance. This is accomplished by adjusting the phase controlled pulse (or pulses) prior to the contact touch pulse. The phase controlled pulse can be established empirically for a particular input voltage and coil resistance, but the problem remains that if the voltage changes or the coil resistance changes, then the performance of the contactor will change for the same set of pulses. A means of compensating for the changes in voltage and coil resistance is to adjust the control pulse based on the peak current ($I_{peak}$) of the first pulse and the voltage. The first pulse must always have the same duration so that there is a basis for performing calculations based on $I_{peak}$.

Figure 4:
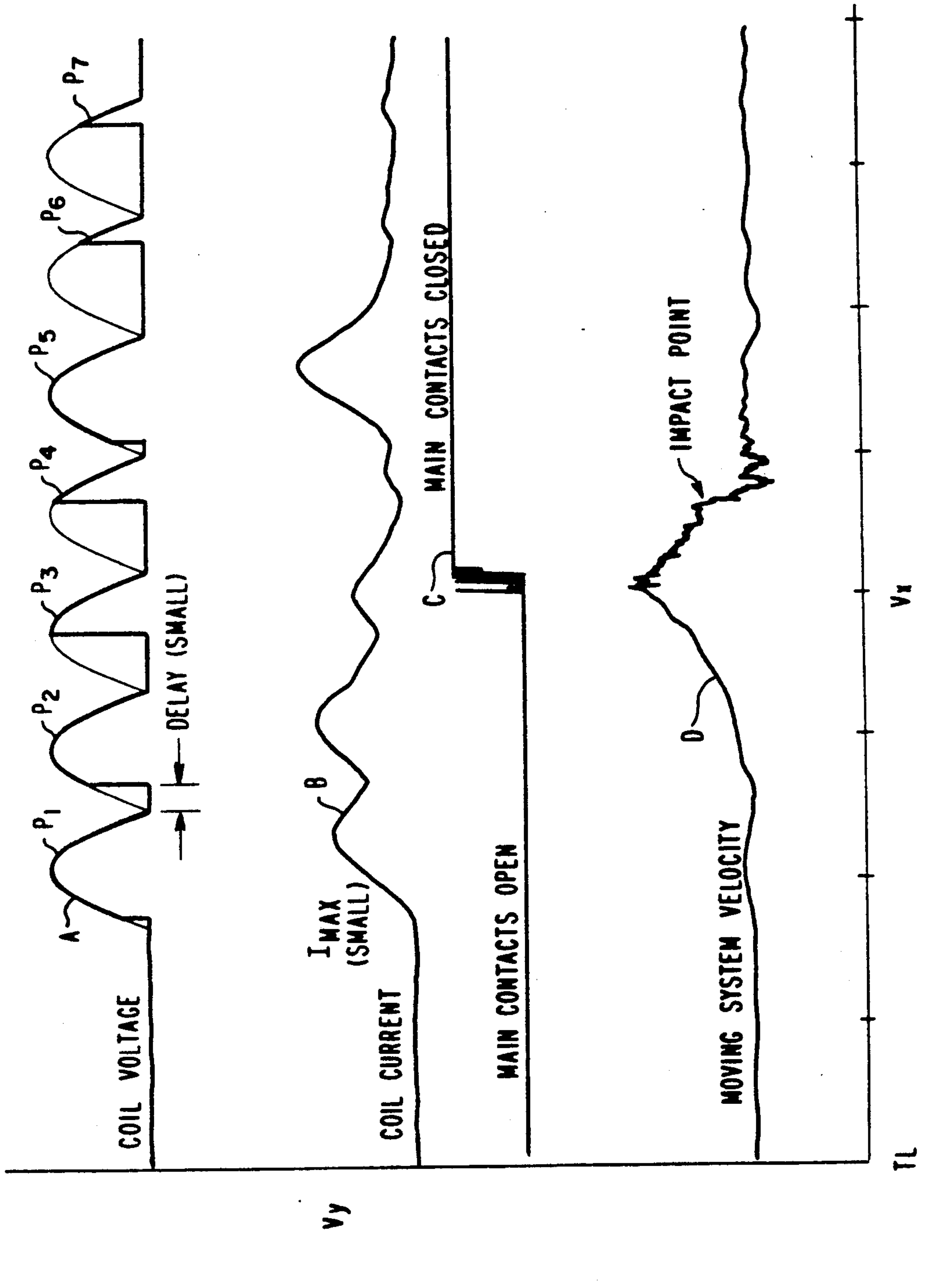
FIG. 4 is a set of waveforms and curves similar to those of FIG. 3 except for a different peak voltage of the voltage pulses applied to the contactor.

For instance, in the example of FIG. 3, the voltage is 122 vac and the peak current, $I_{peak}$, for the first pulse is relative high so that the delay $\alpha_2$ of the second pulse is large and the conduction angle $\beta_2$ is relatively small. Turning to FIG. 4, where the voltage is only 98 vac and the current is relatively low, it can be seen that the delay, $\alpha_2$, is much shorter and the conduction angle, $\beta_2$, is much larger. If the voltage remains constant, but the current increases indicating a reduction in coil resistance, the delay of the second pulse is extended. On the other hand, a reduction in current with a constant voltage indicates an increase in coil resistance and the delay of the control pulse is shortened.

Modulation of the width of the second pulse $P_2$, can be achieved by developing a voltage representative of the coil current and inputting it along with the pulse voltage into the microcomputer. We have found that the algorithm for determining the delay of the second pulse is as follows:

$$\text{Delay of Control Pulse} = [K1 \cdot I_{peak} - K2 \cdot \text{VOLTS} - K3] \cdot K4$$

where:

- Kl(volts/amp) is determined by the scaling of the circuit and/or microprocessor software. In the exemplary system, Kl would equal the resistance of resistor 82 and the effective resistance of potentiometer 84, multiplied by the gain G, of op amp CCA in the custom chip 111.
- K2 (no units) is the ratio of total impedance of dc resistance (Z/R) or at 25 C.
- K3 (volts) is the offset that is required when Kl is restricted in its selection. If Kl is totally selectable, then the K3 constant will be zero.
- K4 (seconds/volt) is the rate at which delay should change for a one volt change associated with the current or voltage change.
- These constants are best derived empirically by taking data for various voltages, and peak currents, and setting control pulse delay for the desired closing. From this the constants (Ks) can be derived.

An example of application of the algorithm is as follows:

K1=30.3 volts/amp
K2=0.5
K3=68 volts
K4=0.0001 sec/volt

The fourth through seventh pulses have fixed time delays which provide sufficient energy to minimize bounce following impact of the movable armature against the fixed armature. The small subsequent pulses (not shown) then hold the contacts closed.

Figure 6:
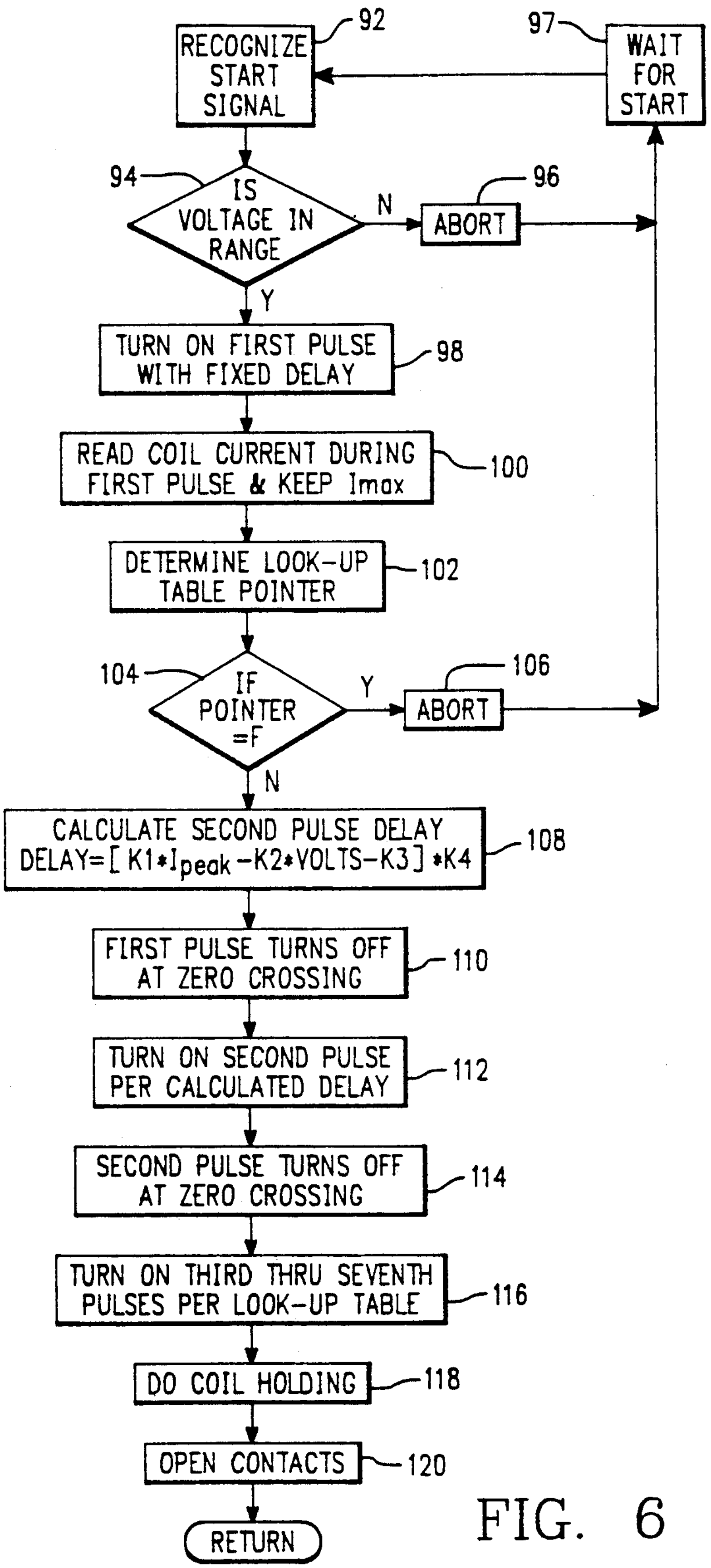
FIG. 6 is a flow chart of a suitable computer program for operating the microcomputer of the control circuit of FIG. 5 in accordance with the teachings of the invention.

FIG. 6 illustrate a flow chart of a suitable program for the microprocessor U2 to implement the invention. First the microprocessor must recognize the start signal at 92. In the exemplary system, the microprocessor must detect three start signals in succession to initiate the closing routine to preclude false closures. A check is then made of the voltage at 94. If the voltage is too low, it will not be possible to close the contactor even with full conduction of the control pulse. If the voltage is too high, the contactor could be damaged. Consequently, if the voltage is not in range, operation of the contactor is aborted at 96 and the program waits for a new start signal at 97. If the voltage is within range, the switch 72 is turned on at 98 to gate the first pulse with a fixed delay (zero delay in the exemplary system). The microprocessor then reads the coil current during the first pulse and saves $I_{max}$ as the peak current at 100. Next, the microprocessor selects at 102 a pointer for a look-up table based upon $I_{max}$. The look-up table, which is shown in FIG. 7, determines the delay for pulses 3 through 7 (in milliseconds). If $I_{max}$ is above a preset value, for instance above 4.0 amperes in the example, pointer 1 is selected. If the peak current on the first pulse is between 3.7 and 4.0 amperes, pointer zero is selected, and if below a preset value, such as 3.7 amperes, pointer F is chosen. Selection of the pointer adjusts the response of the contactor. If the peak current measured during the first pulse is above the desired minimum, pointer 1 is selected and the full advantages of the invention are achieved. If the current is below the desired level, but above the minimum, conditions are marginal for operation and pointer 0 is selected. It can be seen that with pointer 0 selected, there is essentially full conduction for pulses 3 through 7. If the current is below the minimum for operation, as indicated by detection at 104 of the selection of pointer F, operation of the contactor is aborted at 106 and the program waits for another start signal at 97. Although the armature begins to move in response to the first pulse, the energy imparted to the armature is insufficient to bring the contacts even to the touch position as can be seen from FIGS. 3 and 4 and the kickout spring returns the contacts to the fully open position.

With either pointer 1 or 0 selected, the microprocessor calculates the delay for the second (control) pulse at 108 using the relationship explained above. The first pulse is then turned off at the zero crossing as indicated at 110 and the second pulse is turned on at 112 using the delay calculated at 108. The second pulse is turned off at its zero crossing as indicated at 114. The third through seventh pulses are then turned on at 116 using the delays in the look-up table indicated by the appropriate pointer. The microprocessor then performs a coil holding routine at 118 in which small pulses are applied to the contactor coil to maintain the contacts closed until an open contacts signal is received at 120 and energization of the coil is terminated.

It can be appreciated from the above that the invention provides superior contactor performance in the areas of contact bounce and impact velocity over a full range of voltages and coil resistances. It is unique in that it measures the peak current of the first pulse and the voltage and adjusts the time delay of the second pulse such that the total energy in the two pulses is constant. This results in the contact touch time being synchronous and the resulting contact bounce and impact velocity both being low.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. An electrical contactor comprising:

first and second electrical contact means which are normally open;

an electromagnet having a coil and a movable armature mechanically connected to close said electrical contacts in response to current through said coil;

spring means resisting closure of said contacts by said electromagnet; and energizing means gating voltage pulses to said coil at controlled conduction angles, said energizing means gating a first voltage pulse to said coil, monitoring the electrical response of said coil to said first voltage pulse and selectively varying the conduction angle at which at least one subsequent voltage pulse is gated to said coil as a function of said electrical response of said coil to said first voltage pulse to close said first and second electrical contact means against resistance by the spring means with a predetermined closure characteristic.

2. The electrical contactor of claim 1 wherein said energizing means gates said first pulse to said coil at a fixed conduction angle.

3. The electrical contactor of claim 2 wherein said energizing means gates said first pulse to said coil at a fixed substantially full conduction angle.

4. The electrical contactor of claim 2 wherein said electrical response of said coil to the first voltage pulse monitored by said energizing means includes the current through said coil produced by said first voltage pulse.

5. The electrical contactor of claim 4 wherein said electrical response of said coil monitored by said energizing means includes the peak current through said coil produced by said first voltage pulse and the voltage of said first voltage pulse.

6. The electrical contactor of claim 5 wherein said energizing means gates pulses subsequent to the second voltage pulse to the coil at established conduction angles and gates the second voltage pulse to said coil at a conduction angle which is varied as a function of said peak current and the voltage of the first voltage pulse to deliver a constant predetermined amount of electrical energy to said coil.

7. The electrical contactor of claim 4 wherein said energizing means gates voltage pulses subsequent to said second voltage pulse to said coil in accordance with a selected one of at least two sets of predetermined conduction angles, said selected one of said sets of conduction angles being selected as a function of said current produced in said coil by said first voltage pulse.

8. The electrical contactor of claim 7 wherein one of said sets of conduction angles comprises substantially full conduction angles which are selected by said energizing means as said selected one set of conduction angles when said current produced in said coil by said first voltage pulse is less than a predetermined value.

9. The electrical contactor of claim 8 wherein said energizing means aborts closure of said electrical contact means by terminating gating of voltage pulses to said coil when the current produced in said coil by said first voltage pulse is below a second, lower predetermined value.

10. The electrical contactor of claim 2 wherein said energizing means aborts closure of said electrical contact means by terminating gating of voltage pulses to said coil when said electrical response of said coil to said first voltage pulse is not within predetermined limits.

11. The electrical contactor of claim 10 wherein said energizing means monitors as said electric response of the coil to the current produced in said coil by said first voltage pulse and the voltage of said first voltage pulse, and aborts closure of said electrical contacts when either said current or said voltage is not within predetermined limits.

12. The electrical contactor of claim 2 wherein said energizing means gates voltage pulses to said coil at conduction angles selected to always close said electrical contacts on a selected voltage pulse subsequent to the second voltage pulse.

13. The electrical contactor of claim 12 wherein said electrical contact means touch at a point in travel of said moveable armature and seal with said moveable armature abutting a fixed armature, said energizing means gating said voltage pulses to said coil at conduction angles which produce a current in said coil which is decaying when said electrical contact means touch and which continues to decay as said contacts seal and said movable armature abuts said fixed armature.

14. The electrical contactor of claim 13 wherein said energizing means gates voltage pulses subsequent to said second voltage pulse to said coil at fixed conduction angles when said electrical response of said coil to said first voltage pulse is within predetermined limits.

15. The electrical contactor of claim 14 wherein said electrical response of said coil to the first voltage pulse monitored by said energizing means includes the current through the coil produced by said first voltage pulse, and wherein said energizing mean gates voltages pulses subsequent to said second voltage pulse to said coil at said fixed conduction angles when said current is above a predetermined value.

16. The electrical contactor of claim 15 wherein said electrical contact means touch and seal on the third voltage pulse.

17. An electrical contactor comprising:

first and second electrical contact means which are normally open;

an electromagnet having a coil and a movable armature mechanically connected to close said electrical contacts in response to current through said coil;

spring means resisting closure of said contacts by said electromagnet; and energizing means gating voltage pulses to said coil at controlled conduction angles, said energizing means gating a first voltage pulse to said coil at a fixed conduction angle, monitoring the peak current through said coil produced by said first voltage pulse and the voltage of said first voltage pulse, and selectively varying the conduction angle at which a second voltage pulse is gated to said coil such that a constant predetermined amount of electrical energy is delivered to said coil despite variations in voltage and the condition of the coil to close said first and second electrical contact means against resistance by the spring means with a low impact velocity.

18. The electrical contactor of claim 17 wherein said energizing means gates said voltage pulses to said coil at conduction angles selected to always close said electrical contacts on a selected voltage pulse subsequent to said second voltage pulse.

19. The electrical contactor of claim 18 wherein said energizing means gates voltage pulses subsequent to said second voltage pulse to said coil at fixed conduction angles when the peak current through said coil produced by said first voltage pulse is above a first predetermined value.

20. The electrical contactor of claim 17 wherein said energizing means gates voltage pulses subsequent to said second voltage pulse in accordance with a selected one of at least two sets of conduction angles with said selected one set of conduction angles determined by the peak current through said coil produced by said first voltage pulse.

21. The electrical contactor of claim 20 wherein the selected one set of conduction angles for voltage pulses subsequent to the second voltage pulse are substantially full conduction angles when said peak current through said coil in response to the first voltage pulse is below a first predetermined value.

22. The electrical contactor of claim 21 wherein said energizing means aborts closing said electrical contact means by terminating gating voltage pulses to said coil when said peak current through said coil produced by said first voltage pulse is below a second predetermined value.

23. An electrical contactor comprising:

first and second electrical contact means which are normally open;

an electromagnet having a coil and a movable armature mechanically connected to close said electrical contacts in response to current through said coil;

spring means resisting closure of said contacts by said electromagnet;

energizing means gating voltage pulses to said coil at controlled conduction angles, said energizing means gating a first voltage pulse to said coil at a fixed conduction angle, monitoring the electrical current through said coil produced by said first voltage pulse selectively varying the conduction angle at which at least one subsequent voltage pulse is gated to said coil as a function of said electrical response of said coil to said first voltage pulse to close said first and second electrical contact means against resistance by the spring means with a predetermined closure characteristic;

wherein said energizing means gates voltage pulses subsequent to said second voltage pulse to said coil in accordance with a selected one of at least two sets of predetermined conduction angles, said selected one of said sets of conduction angles being selected as a function of said current produced in said coil by said firs voltage pulse;

wherein one of said sets of conduction angles comprises substantially full conduction angles which are selected by said energizing mean as said selected one set of conduction angles when said current produced in said coil by said first voltage pulse is less than a predetermined value; and wherein said energizing means aborts closure of said electrical contact means by determinating gating of voltage pulses to said coil when the current produced in said coil by said fist voltage pulse is below a second, lower predetermined value.

24. An electrical contactor comprising:

first and second electrical contact means which are normally open; p1 an electromagnet having a coil and a movable armature mechanically connected to close said electrical contacts in response to current through said coil;

spring means resisting closure of said contacts by said electromagnet;

energizing mean gating voltage pulses to said coil at controlled conduction angles, said energizing means gating a first voltage pulse to said coil at a fixed conducting angle, monitoring the electrical response of said coil to said first voltage pulse and selectively varying the conduction angle at which at least one subsequent voltage pulse is gated to said coil as a function of said electrical response of said coil to said first voltage pulse to close said fist and second electrical contact means against resistance by the spring means with a predetermined closure characteristic; and wherein said energizing mean aborts closure of said electrical contact mean by terminating gating of voltage pulses to said coil when said electrical response of said coil to said first voltage pulse is not within predetermined limits.

25. The electrical contactor of claim 24 wherein said energizing means monitors as said electric response of the coil to the current produced in said coil by said first voltage pulse and the voltage of said first voltage pulse, and aborts closure of said electrical contacts when either said current or said voltage is not within predetermined limits.

26. An electrical contractor comprising:

first and second electrical contact means which are normally open;

an electromagnet having a coil and a movable armature mechanically connected to close said electrical contacts in response to current through said coil;

spring means resisting closure of said contacts by said electromagnet;

energizing means gating voltage pulses to said coil at controlled conduction angles, said energizing means gating a first voltage pulse to said coil at a first conduction angle, monitoring the electrical response of said coil to said first voltage pulse and selectively varying the conduction angle at which at least on subsequent voltage pulse is gated to said coil as a function of said electrical response of said coil to said first voltage pulse to close said fist and second electrical contact means against resistance by the spring means with a predetermined closure characteristic; and wherein said energizing means gates voltage pulses to said coil at conduction angles elected to always close said electrical contacts on a selected voltage pulse subsequent to the second voltage pulse.

27. The electrical contactor of claim 26 wherein said electrical contact means touch at a point in travel of said movable armature and seal with said movable armature abutting a fixed armature, said energizing means gating said voltage pulses to said coil at conduction angles which produce a current in said coil which is decaying when said electrical contact means touch and which continues to decay as said contacts seal and said movable armature abuts said fixed armature.

28. The electrical contactor of claim 27 wherein said energizing means gates voltage pulses subsequent to said second voltage pulse to said coil at fixed conduction angles when said electrical response of said coil to said fist voltage pulse is within predetermined limits.

29. The electrical contactor of claim 28 wherein said electrical response of said coil to the list voltage pulse monitored by said energizing means includes the current through the coil produced by said fist voltage pulse, and wherein said energizing mean gates voltages pulses subsequent to said second voltage pulse to said coil at said fixed conduction angles when said current is above a predetermined value.

30. The electrical contactor of claim 29 wherein said electrical contact means though and seal on the third voltage pulse.

31. An electrical contactor comprising:

first and second electrical contact means which are normally open;

an electromagnet having a coil and a movable armature mechanically connected to close said electrical contacts in response to current through said coil;

spring means resisting closure f said contacts by said electromagnet;

energized means gating voltage pulses to said coil at controlled conduction angles, said energizing means gating a first voltage pulse to said coil at a fixed conduction angle, monitoring the peak current through said coil produced by said first voltage pulse and the voltage of said fist voltage pulse, and selectively varying the concoction angle at which a second voltage pulse is gated to said coil such that a constant predetermined amount of electrical energy si delivered to said coil despite variations in voltage and the condition of the coil to close said first and second electrical contact means against resistance by the spring means with a low impact velocity; and wherein said energizing means gates said voltage pulses to said coil at conduction angles selected to always close said electrical contacts on a selected voltage pulse subsequent to said second voltage pulse.

32. The electrical contactor of claim 31 wherein said energize means gates voltage pulses subsequent to said second voltage pulse to said coil at fixed conduction angles when the peak current through said coil produced by said first voltage pulse is above a first predetermined value.

33. An electrical contactor comprising:

first and second electrical contact means which are normally open;

an electromagnet having a coil and a movable armature mechanically connected to close said electrical contacts in response to current through said coil;

spring means resisting closure of said contacts by said electromagnet;

energizing means gating voltage pulses to said coil at controlled conduction angles, said energizing means gating a fist voltage pulse to said coil at a fixed conduction angle, monitoring the peak current through said coil produced by said first voltage pulse and the voltage of said fist voltage pulse, and selectively varying the conduction angle at which a second voltage pulse is gated to said coil such that a constant predetermined amount of electrical energy is delivered to said coil despite variations in voltage an the condition of the coil to close said first and second electrical contact means against resistance by the spring means with a low impact velocity;

wherein said energizing means gates voltage pulses subsequent to said second voltage pulse in accordance with a selected one of at least tow sets of conduction angles with said selected one set of conduction angles determined by the peak current through said coil produced by said first voltage pulse;

wherein the selected on set of conduction angles for voltage pulses subsequent o the second voltage pulse are substantially full conduction angles when said peak current through said coil in response to the first voltage pulse is below a first predetermined value; and wherein said energizing means aborts closing said electrical contact means by terminating dating voltage pulses to said coil when said peak current through said coil produced by said first voltage pulse is below a second predetermined value.

* * * * *